(12) United States Patent
Wu et al.

(10) Patent No.: US 9,666,570 B2
(45) Date of Patent: May 30, 2017

(54) MEMORY DEVICE AND METHOD OF MANUFACTURING THE SAME

(71) Applicant: Winbond Electronics Corp., Taichung (TW)

(72) Inventors: Bo-Lun Wu, Taichung (TW); Chia-Hua Ho, Taichung (TW); Ting-Ying Shen, Taichung (TW); Meng-Hung Lin, Taichung (TW)

(73) Assignee: Winbond Electronics Corp., Taichung (TW)

(*) Notice: Subject to any disclaimer, the term of this patent is extended or adjusted under 35 U.S.C. 154(b) by 0 days.

(21) Appl. No.: 14/918,567

(22) Filed: Oct. 21, 2015

(65) Prior Publication Data

US 2017/0018709 A1    Jan. 19, 2017

(30) Foreign Application Priority Data

Jul. 15, 2015    (CN) .......................... 2015 1 0415026

(51) Int. Cl.
*H01L 25/18*    (2006.01)
*H01L 27/02*    (2006.01)
(Continued)

(52) U.S. Cl.
CPC .......... *H01L 25/18* (2013.01); *H01L 27/0248* (2013.01); *H01L 27/1052* (2013.01);
(Continued)

(58) Field of Classification Search
None
See application file for complete search history.

(56) References Cited

U.S. PATENT DOCUMENTS

| 7,898,839 | B2 | 3/2011 | Aoki | |
| 8,785,238 | B2* | 7/2014 | Kawashima | ........ H01L 45/1233 257/2 |

(Continued)

FOREIGN PATENT DOCUMENTS

TW    201330180    7/2013

OTHER PUBLICATIONS

Definition of "between" downloaded from URL<http://www.merriam-webster.com/dictionary/between> on Jul. 27, 2016.*

*Primary Examiner* — Joseph Schoenholtz
(74) *Attorney, Agent, or Firm* — Jiang Chyun IP Office (57) ABSTRACT

The invention provides a memory device and a manufacturing method thereof. The memory device includes a substrate, a capacitor, a protection device, a first metal interconnect, and a second metal interconnect. The capacitor is located on the substrate of a first region. The protection device is located in the substrate of a second region. The capacitor includes a plurality of bottom electrodes, a top electrode, and a capacitor dielectric layer. The top electrode has a first portion and a second portion, wherein the second portion is extended to the second region. The capacitor dielectric layer is located between the bottom electrodes and the top electrode. The first metal interconnect is located between the capacitor and the substrate. The second metal interconnect is located between the second portion of the top electrode and the protection device. The top electrode is electrically connected to the protection device through the second metal interconnect.

20 Claims, 6 Drawing Sheets

(51) Int. Cl.
*H01L 27/105* (2006.01)
*H01L 45/00* (2006.01)
*H01L 27/24* (2006.01)

(52) U.S. Cl.
CPC ...... *H01L 27/2418* (2013.01); *H01L 45/1233* (2013.01); *H01L 45/1253* (2013.01); *H01L 45/146* (2013.01); *H01L 45/16* (2013.01); *H01L 45/1608* (2013.01); *H01L 45/1675* (2013.01)

(56) References Cited

U.S. PATENT DOCUMENTS

| | | | |
|---|---|---|---|
| 8,853,762 B2 | 10/2014 | Tu et al. | |
| 2004/0099897 A1* | 5/2004 | Tsutsue | H01L 23/5223 257/303 |
| 2013/0168631 A1* | 7/2013 | Chen | G11C 14/009 257/4 |
| 2013/0230963 A1* | 9/2013 | Kim | H01L 29/861 438/396 |
| 2013/0240821 A1 | 9/2013 | Toh et al. | |
| 2014/0269005 A1* | 9/2014 | Kang | H01L 45/1666 365/148 |

* cited by examiner

MEMORY DEVICE AND METHOD OF MANUFACTURING THE SAME

CROSS-REFERENCE TO RELATED APPLICATION

This application claims the priority benefit of Chinese application serial no. 201510415026.7, filed on Jul. 15, 2015. The entirety of the above-mentioned patent application is hereby incorporated by reference herein and made a part of this specification.

BACKGROUND OF THE INVENTION

Field of the Invention

The invention relates to a semiconductor device and a manufacturing method thereof, and more particularly, to a memory device and a manufacturing method thereof Description of Related Art A resistive random access memory (RRAM) is a next-generation non-volatile memory that is currently being actively developed. The RRAM is a simple metal-insulator-metal (MIM) structure, which can be integrated in a subsequent metal process through two additional masking steps. However, plasma-induced damage (PID) caused by a subsequent deposition process and dry etching process may occur to the RRAM formed through the above method. The plasma-induced damage not only affects the electrical performance of the memory device, but also reduces the reliability and the yield of a product.

SUMMARY OF THE INVENTION

The invention provides a memory device and a manufacturing method thereof capable of reducing the occurrence of plasma-induced damage, thus increasing the reliability and the yield of a product.

The invention provides a memory device, including a substrate, a capacitor, a protection device, a first metal interconnect, and a second metal interconnect. The substrate has a first region and a second region. The capacitor is located on the substrate of the first region. The capacitor includes a plurality of bottom electrodes, a top electrode, and a capacitor dielectric layer. The top electrode has a first portion and a second portion. The first portion covers the bottom electrodes, and the second portion is extended onto the substrate of the second region. The capacitor dielectric layer is located between the bottom electrodes and the first portion of the top electrode. The protection device is located in the substrate of the second region. The first metal interconnect is located between the capacitor and the substrate, wherein the bottom electrodes are electrically connected to the substrate through the first metal interconnect. The second metal interconnect is located between the second portion of the top electrode and the protection device, wherein the second portion of the top electrode is electrically connected to the protection device through the second metal interconnect.

In an embodiment of the invention, the capacitor dielectric layer is a continuous planar structure, a continuous nonplanar structure, or a non-continuous planar structure.

In an embodiment of the invention, the first portion of the top electrode is a continuous planar structure or a continuous nonplanar structure.

In an embodiment of the invention, the memory device further includes a dielectric layer located between the bottom electrodes. The capacitor dielectric layer is a continuous planar structure, and covers the top surfaces of the bottom electrodes and the dielectric layer.

In an embodiment of the invention, the capacitor dielectric layer is a continuous nonplanar structure, and covers the top surfaces and the sidewalls of the bottom electrodes.

In an embodiment of the invention, the capacitor dielectric layer is a non-continuous planar structure covering the top surfaces of the bottom electrodes.

In an embodiment of the invention, the memory device further includes a plurality of spacers respectively located on the sidewalls of the bottom electrodes and the capacitor dielectric layer.

In an embodiment of the invention, the protection device is a diode, a bipolar junction transistor, or a combination thereof.

In an embodiment of the invention, the material of the capacitor dielectric layer is a variable-resistance material.

In an embodiment of the invention, the variable-resistance material is silicon oxide or transition metal oxide. The transition metal oxide is $ZrO_2$, $HfO_2$, $Ta_2O_5$, $Al_2O_3$, $TiO_2$, or a combination thereof.

The invention provides a manufacturing method of a memory device including the following steps. A substrate is provided. The substrate has a first region and a second region. A capacitor is formed on the substrate of the first region. The capacitor includes a plurality of bottom electrodes, a top electrode, and a capacitor dielectric layer. The top electrode has a first portion and a second portion. The first portion covers the bottom electrodes, and the second portion is extended onto the substrate of the second region. The capacitor dielectric layer is located between the bottom electrodes and the first portion of the top electrode. A protection device is formed in the substrate of the second region. A first metal interconnect is formed between the capacitor and the substrate. The first metal interconnect is electrically connected to the bottom electrodes and the substrate. A second metal interconnect is formed between the second portion of the top electrode and the protection device. The second metal interconnect is electrically connected to the second portion of the top electrode and the protection device.

In an embodiment of the invention, the method of forming the capacitor on the substrate of the first region is as follows. The bottom electrodes are formed on the substrate. A dielectric layer is formed on the substrate. The dielectric layer is disposed between the bottom electrodes. The capacitor dielectric layer is formed on the bottom electrodes. The capacitor dielectric layer covers the top surfaces of the bottom electrodes and the dielectric layer. The top electrode is formed on the capacitor dielectric layer.

In an embodiment of the invention, the dielectric layer and the bottom electrodes are coplanar, and the capacitor dielectric layer is a continuous planar structure.

In an embodiment of the invention, the method of forming the capacitor on the substrate of the first region is as follows. The bottom electrodes are formed on the substrate. The capacitor dielectric layer is conformally formed on the bottom electrodes. The capacitor dielectric layer covers the top surfaces and the sidewalls of the bottom electrodes. The top electrode is formed on the capacitor dielectric layer.

In an embodiment of the invention, the capacitor dielectric layer and the top electrode above the capacitor dielectric layer are continuous nonplanar structures.

In an embodiment of the invention, the method of forming the capacitor on the substrate of the first region is as follows. The bottom electrodes and the capacitor dielectric layer are formed on a substrate in order. The capacitor dielectric layer is a non-continuous planar structure, and covers the top surfaces of the bottom electrodes. A plurality of spacers is respectively formed on the sidewalls of the bottom electrodes and the capacitor dielectric layer. The top electrode is formed on the capacitor dielectric layer. The top electrode covers the top surface of the capacitor dielectric layer and the top surfaces and the sidewalls of the spacers.

In an embodiment of the invention, the method of respectively forming the spacers on the sidewalls of the bottom electrodes and the capacitor dielectric layer is as follows. A plurality of sacrificial layers is respectively formed on a capacitor dielectric layer. A spacer material layer is conformally formed on the sacrificial layers. The spacer material layer on the top surfaces of the sacrificial layers is removed to respectively form the spacers on the sidewalls of the bottom electrodes and the capacitor dielectric layer. The sacrificial layers are removed.

In an embodiment of the invention, the material of the sacrificial layers includes oxide, nitride, or a combination thereof.

In an embodiment of the invention, the material of the spacer material layer includes nitride, aluminum oxide, or a combination thereof.

In an embodiment of the invention, after the capacitor is formed, the top electrode is further patterned to form a plurality of strip top electrodes.

Based on the above, in the invention, the top electrode is electrically connected to the protection device, thus preventing plasma-induced damage caused by a subsequent deposition process and dry etching process, and as a result the reliability and the yield of a product are increased.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
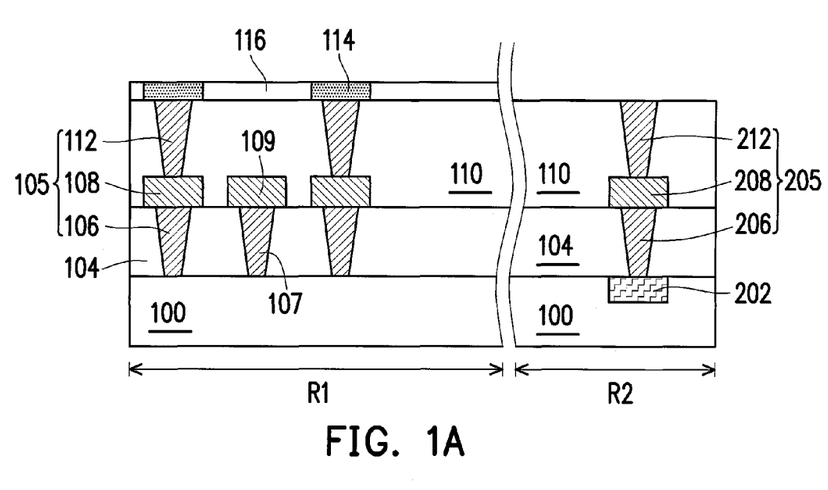
FIG. 1A to FIG. 1C are cross-sectional schematics of a manufacturing process of a memory device of the first embodiment of the invention.
Figure 1B:
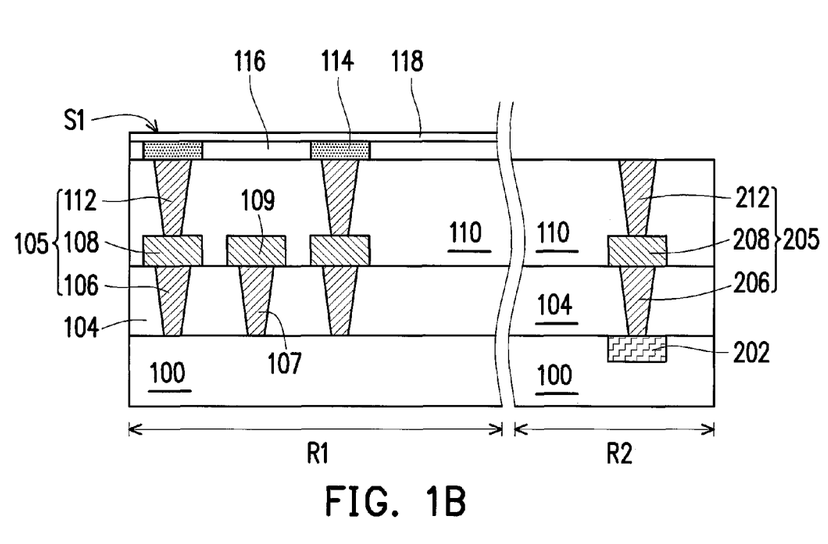
Figure 1C:
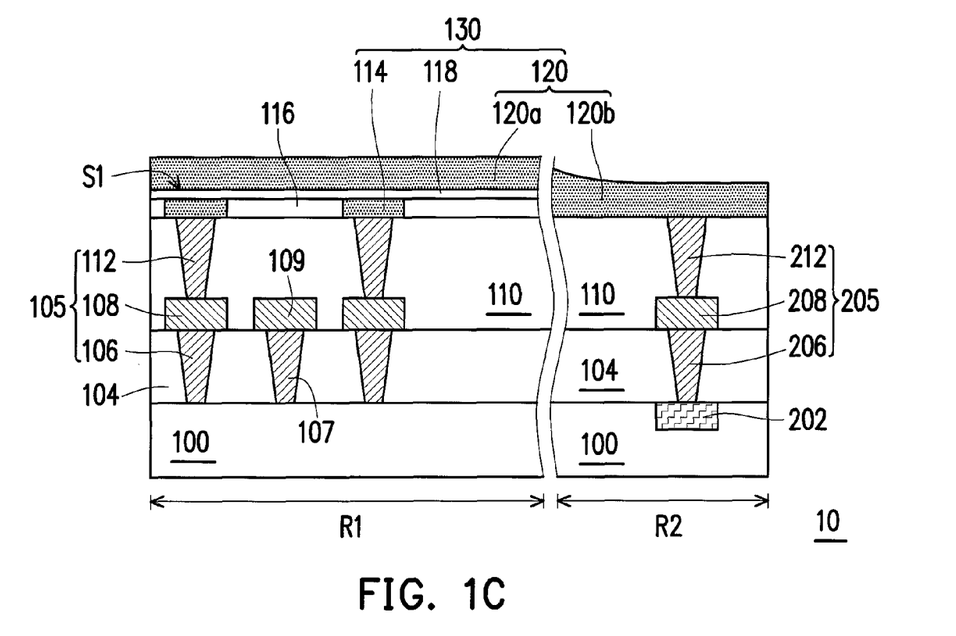

FIG. 1A to FIG. 1C are cross-sectional schematics of a manufacturing process of a memory device of the first embodiment of the invention.

Referring to FIG. 1A, a substrate 100 is provided. The substrate 100 has a first region R1 and a second region R2. In the present embodiment, the substrate 100 is not particularly limited. For instance, the substrate 100 can be any semiconductor substrate, a substrate having other film layers thereon, or a substrate having other devices therein. In an embodiment, the first region R1 can be, for instance, a memory cell region, and the second region R2 can be, for instance, a protection device region or a peripheral circuit region.

Then, a protection device 202 is formed in the substrate 100 of the second region R2. In an embodiment, the protection device 202 can be, for instance, a diode, a bipolar junction transistor, or a combination thereof. Any protection device capable of preventing plasma-induced damage caused by a subsequent deposition process and dry etching process can be used, and the type, the material, and the dimension of the protection device of the invention can be adjusted as needed.

Then, dielectric layers 104 and 110 are formed on the substrate 100. The material of the dielectric layers 104 and 110 is, for instance, a low-k material or silicon oxide. The low-k material is, for instance, silicon oxynitride (SiOC). The forming method of the dielectric layers 104 and 110 can be, for instance, a chemical vapor deposition method.

Then, a metal interconnect 105 is formed on the substrate 100 of the first region R1. A metal interconnect 205 is formed on the substrate 100 of the second region R2. In the present embodiment, the metal interconnect 105 and the metal interconnect 205 can be formed at the same time. However, the invention is not limited thereto, and in other embodiments, the metal interconnect 105 can be formed first, and then the metal interconnect 205 is formed. On the other hand, the metal interconnect 205 can also be formed first, and then the metal interconnect 105 is formed.

For instance, the forming method of the metal interconnect 105 and the metal interconnect 205 is as follows. A plurality of contact window openings is formed in the dielectric layer 104 of the first region R1 and the second region R2, and the contact window openings expose the surface (not shown) of the substrate 100. Then, a conductive material is filled in the contact window openings to form contact plugs 106, 107, and 206 (as shown in FIG. 1A). Then, patterned conductive layers 108, 109, and 208 are formed on the dielectric layer 104 of the first region R1 and the second region R2. The patterned conductive layer 108 is electrically connected to the contact plug 106; the patterned conductive layer 109 is electrically connected to the contact plug 107; and the patterned conductive layer 208 is electrically connected to the contact plug 206. Then, a plurality of contact window openings is formed in the dielectric layer 110 of the first region R1 and the second region R2, and the contact window openings respectively expose the surface (not shown) of the patterned conductive layers 108 and 208. Then, a conductive material is filled in the contact window openings to form contact plugs 112 and 212 (as shown in FIG. 1A). In an embodiment, the patterned conductive layer 109 and the contact plug 107 can be regarded as electrically connected to the source in the substrate 100; the metal interconnect 105 can be regarded as electrically connected to the drain in the substrate 100; and the metal interconnect 205 can be regarded as electrically connected to the protection device 202 in the substrate 100 of the second region R2, but the invention is not limited thereto.

In an embodiment, the material of each of the contact plugs 106, 107, and 206 and the contact plugs 112 and 212 can be, for instance, titanium, titanium nitride, tantalum nitride, tungsten, titanium tungsten, aluminum, copper, or a combination thereof. The material of the patterned conductive layers 108, 109, and 208 can be, for instance, titanium, tungsten, aluminum, copper, or a combination thereof. The material of the contact plugs 106, 107, 206, 112, and 212 and the material of the patterned conductive layers 108, 109, and 208 can be the same, and can also be different. The forming method of the contact plugs 106, 107, 206, 112, and 212 and the patterned conductive layers 108, 109, and 208 can be, for instance, a physical vapor deposition method or a chemical vapor deposition method.

Then, a plurality of bottom electrodes 114 is formed on the dielectric layer 110 of the first region R1. Each of the bottom electrodes 114 is electrically connected to the corresponding metal interconnect 105. The material of the bottom electrodes 114 can be, for instance, titanium, titanium nitride, tantalum nitride, tungsten, titanium tungsten, aluminum, copper, or a combination thereof. The forming method of the bottom electrodes 114 is, for instance, a physical vapor deposition method or a chemical vapor deposition method. Then, a dielectric layer 116 is formed between the bottom electrodes 114. The forming method of the dielectric layer 116 can include, for instance, first forming a dielectric material layer on the substrate 100 to cover the top surfaces and the sidewalls of the bottom electrodes 114 and the top surface (not shown) of the dielectric layer 110. Then, a chemical mechanical polishing (CMP) process is performed to expose the top surfaces of the bottom electrodes 114. In an embodiment, the material of the dielectric material layer can be, for instance, silicon oxide, silicon nitride, boro-phospho-silicate-glass, or a combination thereof, and the forming method thereof can be, for instance, a chemical vapor deposition method. In other embodiments, the steps of forming the bottom electrodes 114 can also be, for instance, depositing a dielectric material layer above the contact plug 112 first, and then patterning the dielectric material layer to define the location of the subsequently formed bottom electrodes 114. Then, a bottom electrode material layer is filled in the dielectric layer 116. Next, a chemical mechanical polishing (CMP) process is performed to planarize and expose the top surfaces of the bottom electrodes 114. In an embodiment, the material of the bottom electrode material layer can be, for instance, titanium, titanium nitride, tantalum nitride, tungsten, titanium tungsten, aluminum, copper, or a combination thereof.

Referring to FIG. 1B, a capacitor dielectric layer 118 is formed on the bottom electrodes 114. The capacitor dielectric layer 118 covers the top surfaces of the bottom electrodes 114 and the dielectric layer 116. In an embodiment, the dielectric layer 116 and the bottom electrodes 114 can be, for instance, coplanar, such that a surface S1 located on the capacitor dielectric layer 118 is also a plane. Since the capacitor dielectric layer 118 is a continuous planar structure and a subsequently formed top electrode 120 is also a continuous planar structure (as shown in FIG. 1C), the window of a subsequent deposition process and lithography process can be increased to prevent damage to the sidewalls of a unit cell during etching and patterning and prevent a reduction in the reliability thereof. As a result, process yield is increased. In an embodiment, the material of the capacitor dielectric layer 118 can be, for instance, a variable-resistance material. The variable-resistance material can be, for instance, silicon oxide or transition metal oxide. The transition metal oxide can be, for instance, $ZrO_2$, $HfO_2$, $Ta_2O_5$, $Al_2O_3$, $TiO_2$, or a combination thereof. However, the invention is not limited thereto, and in other embodiments, the material of the capacitor dielectric layer 118 can be, for instance, a high-k material layer, and the material thereof is, for instance, the oxide of the following elements, such as: hafnium, zirconium, aluminum, titanium, lanthanum, yttrium, gadolinium, tantalum, aluminum nitride, or any combination of the above.

Referring to FIG. 1C, a top electrode 120 is formed on the capacitor dielectric layer 118. The top electrode 120 has a first portion 120a and a second portion 120b. The first portion 120a covers the capacitor dielectric layer 118. The second portion 120b is extended onto the substrate 100 of the second region R2. Therefore, the top electrode 120 of the present embodiment can be electrically connected to the protection device 202 through the metal interconnect 205 to prevent plasma-induced damage caused by a subsequent deposition process and dry etching process. As a result, the reliability and the yield of a product can be increased. In an embodiment, the material of the top electrode 120 can be, for instance, titanium, titanium nitride, tantalum nitride, tungsten, titanium tungsten, aluminum, copper, or a combination thereof. The forming method of the top electrode 120 is, for instance, a physical vapor deposition method or a chemical vapor deposition method.

Moreover, in the present embodiment, after the capacitor 130 is formed, the top electrode 120 can further be patterned to form a plurality of strip top electrodes (not shown). The strip top electrodes can be parallel to subsequently formed bit lines, so as to reduce the loading of the bit lines in order to further increase the reliability and the yield of a product.

Referring to FIG. 1C, the invention provides a memory device 10 including the substrate 100, the dielectric layer 116, the capacitor 130, the protection device 202, the metal interconnect 105, and the metal interconnect 205. The substrate 100 has the first region R1 and the second region R2. The capacitor 130 is located on the substrate 100 of the first region R1. The capacitor 130 includes a plurality of bottom electrodes 114, the top electrode 120, and the capacitor dielectric layer 118. The dielectric layer 116 is located between the bottom electrodes 114. The top electrode 120 has the first portion 120a and the second portion 120b. The first portion 120a covers the top surfaces of the bottom electrodes 114 and the dielectric layer 116, and the second portion 120b is extended onto the substrate 100 of the second region R2. The capacitor dielectric layer 118 is located between the bottom electrodes 114 and the first portion 120a of the top electrode 120. The protection device 202 is located in the substrate 100 of the second region R2. The metal interconnect 105 is located between the capacitor 130 and the substrate 100. The bottom electrodes 114 can be electrically connected to the substrate 100 through the metal interconnect 105. The metal interconnect 205 is located between the second portion 120b of the top electrode 120 and the protection device 202. The second portion 120b of the top electrode 120 can be electrically connected to the protection device 202 through the metal interconnect 205 to prevent plasma-induced damage caused by a subsequent deposition process and dry etching process, thus increasing the reliability and the yield of a product. In an embodiment, the capacitor 130 can be, for instance, a resistive random access memory (RRAM), a dynamic random access memory (DRAM), or a combination thereof, and the invention is not limited thereto.

In the following embodiments, the same or similar devices, components, and layers are represented by similar reference numerals. For instance, the capacitor 130 of FIG. 1C and a capacitor 230 of FIG. 2C and a capacitor 330 of FIG. 3C are the same or similar components. The materials and the forming methods of the same or similar components are not repeated herein.

Figure 2A:
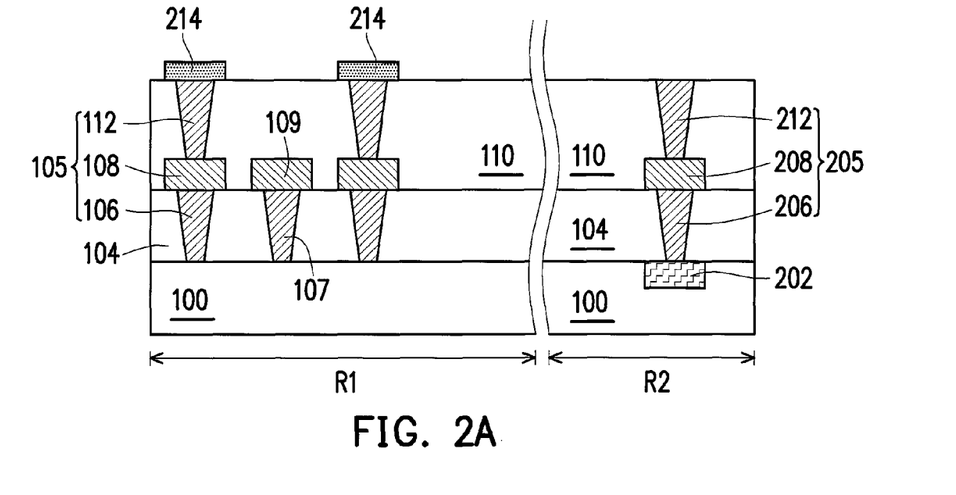
FIG. 2A to FIG. 2C are cross-sectional schematics of a manufacturing process of a memory device of the second embodiment of the invention.
Figure 2B:
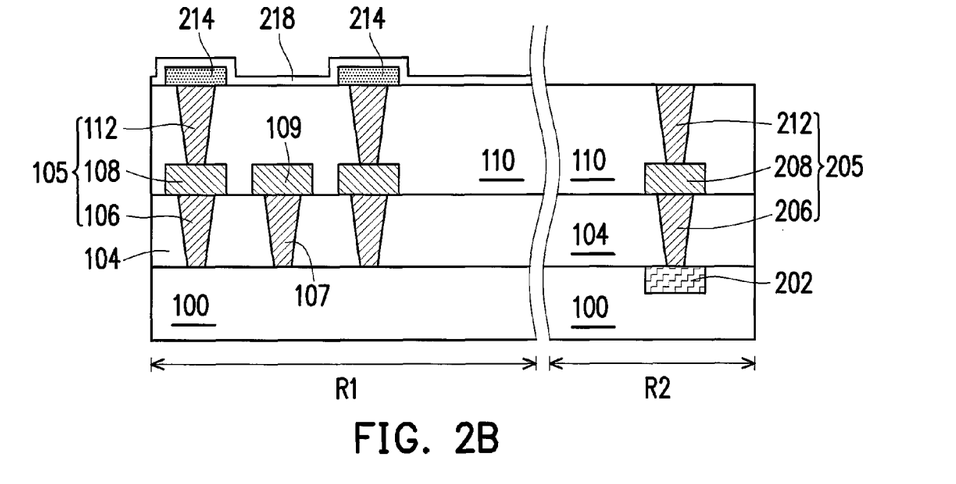
Figure 2C:
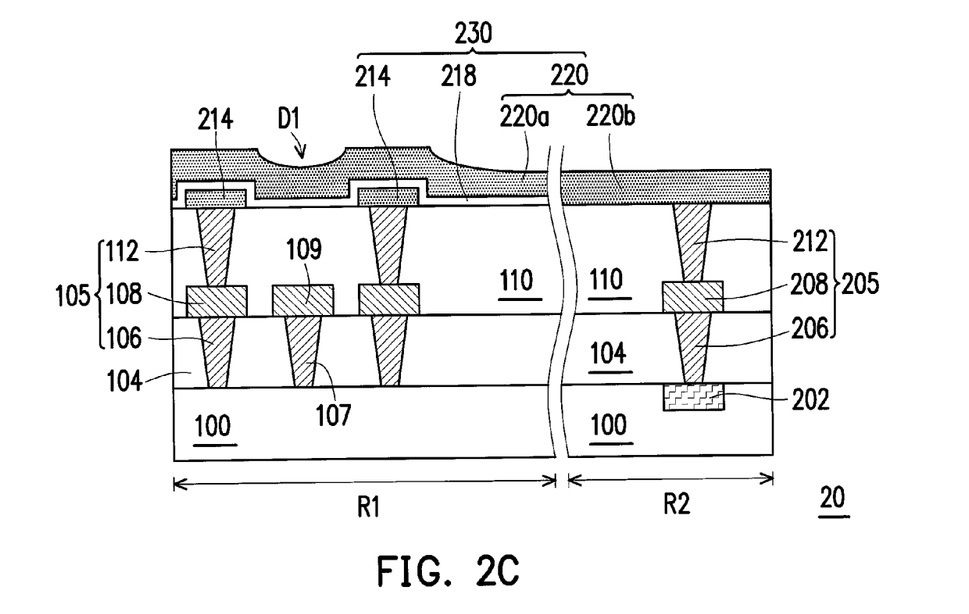

FIG. 2A to FIG. 2C are cross-sectional schematics of a manufacturing process of a memory device of the second embodiment of the invention.

Referring to both FIG. 1A and FIG. 2A, FIG. 1A and FIG. 2A are substantially similar, and the difference between the two is: in FIG. 2A, a plurality of bottom electrodes 214 is only formed on the dielectric layer 110 of the first region R1, and the dielectric layer 116 is not disposed between the bottom electrodes 114.

Referring to FIG. 2B, a capacitor dielectric layer 218 is conformally formed on the bottom electrodes 214. The capacitor dielectric layer 218 covers the top surfaces and the sidewalls of the bottom electrodes 214 and the top surface of the dielectric layer 110. Since the capacitor dielectric layer 218 conformally covers the top surfaces and the sidewalls of the bottom electrodes 214 and the top surface of the dielectric layer 110, the capacitor dielectric layer 218 can be, for instance, a continuous nonplanar structure.

Then, referring to FIG. 2C, a top electrode 220 is formed on the capacitor dielectric layer 218. The top electrode 220 has a first portion 220a and a second portion 220b. The first portion 220a covers the capacitor dielectric layer 218 of the first region R1. The capacitor dielectric layer 218 is disposed between the first portion 220a and the bottom electrodes 214. The second portion 220b is extended onto the substrate 100 of the second region R2, and is electrically connected to the protection device 202 through the metal interconnect 205.

Referring to FIG. 2C, a memory device 20 of the second embodiment of the invention and the memory device 10 of the first embodiment of the invention are substantially similar, and the difference between the two is: the capacitor dielectric layer 218 of the memory device 20 can be, for instance, a continuous nonplanar structure. Therefore, the top electrode 220 disposed above the capacitor dielectric layer 218 can also be, for instance, a continuous nonplanar structure. In an embodiment, the surface corresponding to the top electrode 220 between adjacent bottom electrodes 214 has a recess D1.

Figure 3A:
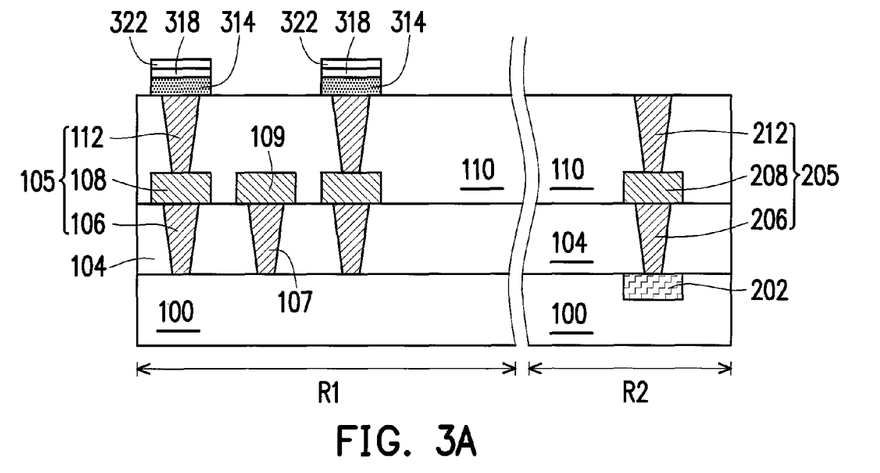
FIG. 3A to FIG. 3C are cross-sectional schematics of a manufacturing process of a memory device of the third embodiment of the invention.
Figure 3B:
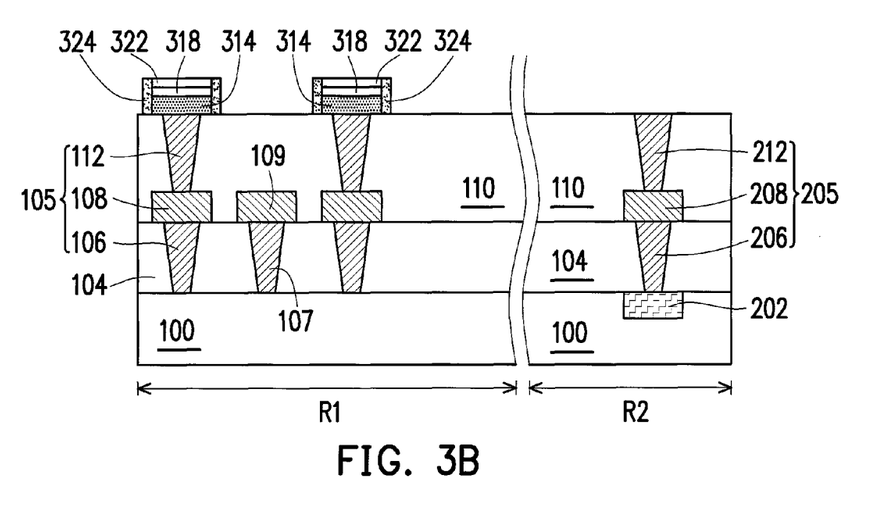
Figure 3C:
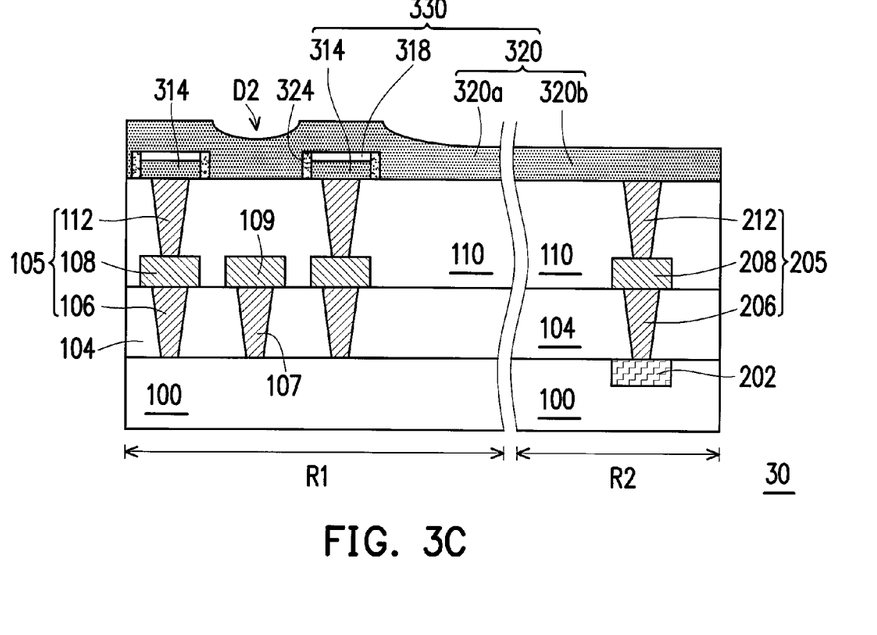

FIG. 3A to FIG. 3C are cross-sectional schematics of a manufacturing process of a memory device of the third embodiment of the invention.

Referring to both FIG. 1A and FIG. 3A, FIG. 1A and FIG. 3A are substantially similar, and the difference between the two is: a plurality of bottom electrodes 314, a plurality of capacitor dielectric layers 318, and a plurality of sacrificial layers 322 are formed on the dielectric layer 110 of the first region R1 of FIG. 3A in order. The capacitor dielectric layers 318 of FIG. 3A can be regarded as non-continuous planar structures covering the top surfaces of the bottom electrodes 314. In an embodiment, the material of the sacrificial layers 322 can be, for instance, oxide, nitride, or a combination thereof. The forming method of the sacrificial layers 322 can be, for instance, a chemical vapor deposition method.

Referring to FIG. 3B, spacers 324 are formed on the sidewalls of the bottom electrodes 314, the capacitor dielectric layers 318, and the sacrificial layers 322. Specifically, the forming method of the spacers 324 is as follows. A spacer material layer is conformally formed on the sacrificial layers 322, and the spacer material layer covers the sidewalls of the bottom electrodes 314, the sidewalls of the capacitor dielectric layers 318, the top surfaces and the sidewalls of the sacrificial layers 322, and the top surface (not shown) of the dielectric layer 110. An etching process is performed to remove a portion of the spacer material layer so as to expose the top surfaces of the sacrificial layers 322 and the top surface of the dielectric layer 110. In an embodiment, the material of the spacer material layer can be, for instance, nitride, aluminum oxide, or a combination thereof.

Referring to FIG. 3C, after the sacrificial layers 322 are removed, a top electrode 320 is formed on the capacitor dielectric layers 318. The top electrode 320 has a first portion 320a and a second portion 320b. The first portion 320a covers the top surfaces of the capacitor dielectric layers 318 of the first region R1 and the top surfaces and the sidewalls of the spacers 324. The second portion 320b is extended onto the substrate 100 of the second region R2, and is electrically connected to the protection device 202 through the metal interconnect 205.

Referring to FIG. 3C, a memory device 30 of the third embodiment of the invention and the memory device 10 of the first embodiment of the invention are substantially similar, and the difference between the two is: the capacitor dielectric layer 318 of the memory device 30 can be, for instance, a non-continuous planar structure covering the top surfaces of the bottom electrodes 314. Therefore, the top electrode 320 disposed on the capacitor dielectric layer 318 can be regarded as a continuous nonplanar structure. In an embodiment, the surface corresponding to the top electrode 320 between adjacent bottom electrodes 314 has a recess D2.

Based on the above, in the invention, the top electrode is electrically connected to the protection device, thus preventing plasma-induced damage caused by a subsequent deposition process and dry etching process, and as a result the reliability and the yield of a product are increased. Moreover, since the capacitor dielectric layer of the first embodiment of the invention is a continuous planar structure and the subsequently formed top electrode is also as continuous planar structure, the window of a subsequent deposition process and lithography process can be increased, thus further increasing process yield.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A memory device, comprising:
   a substrate having a first region and a second region;
   a capacitor located on the substrate of the first region, wherein the capacitor comprises:
      a plurality of bottom electrodes;
      a top electrode having a first portion and a second portion, wherein the first portion covers the bottom electrodes, and the second portion is extended onto the substrate of the second region; and
      a capacitor dielectric layer located between the bottom electrodes and the first portion of the top electrode, wherein the top electrode, the capacitor dielectric layer and the plurality of the bottomed electrodes are directly and subsequently stacked in order;
   a protection device located in the substrate of the second region;
   a first metal interconnect located between the capacitor and the substrate, wherein the bottom electrodes are electrically connected to the substrate through the first metal interconnect; and
   a second metal interconnection sandwiched between the second portion of the top electrode and the protection device, wherein the second portion of the top electrode is electrically connected to the protection device through the second metal interconnection.

2. The memory device of claim 1, wherein the capacitor dielectric layer is a continuous planar structure, a continuous nonplanar structure, or a non-continuous planar structure.

3. The memory device of claim 1, wherein the first portion of the top electrode is a continuous planar structure or a continuous nonplanar structure.

4. The memory device of claim 1, further comprising a dielectric layer located between the bottom electrodes, wherein the capacitor dielectric layer is a continuous planar structure and covers top surfaces of the bottom electrodes and the dielectric layer.

5. The memory device of claim 1, wherein the capacitor dielectric layer is a continuous nonplanar structure, and covers the top surfaces and the sidewalls of the bottom electrodes.

6. The memory device of claim 1, wherein the capacitor dielectric layer is a non-continuous planar structure covering top surfaces of the bottom electrodes.

7. The memory device of claim 6, further comprising a plurality of spacers respectively located on sidewalls of the bottom electrodes and the capacitor dielectric layer.

8. The memory device of claim 1, wherein the protection device is a diode, a bipolar junction transistor, or a combination thereof.

9. The memory device of claim 1, wherein a material of the capacitor dielectric layer can be a variable-resistance material.

10. The memory device of claim 9, wherein the variable-resistance material is silicon oxide or transition metal oxide, the transition metal oxide is $ZrO_2$, $HfO_2$, $Ta_2O_5$, $Al_2O_3$, $TiO_2$, or a combination thereof.

11. A manufacturing method of a memory device, comprising:
    providing a substrate, wherein the substrate has a first region and a second region;
    forming a capacitor on the substrate of the first region, wherein the capacitor comprises:
        a plurality of bottom electrodes;
        a top electrode having a first portion and a second portion, wherein the first portion covers the bottom electrodes, and the second portion is extended onto the substrate of the second region; and
        a capacitor dielectric layer located between the bottom electrodes and the first portion of the top electrode, wherein the top electrode, the capacitor dielectric layer and the plurality of the bottom electrodes are directly and subsequently stacked in order;
    forming a protection device in the substrate of the second region;
    forming a first metal interconnect between the capacitor and the substrate, wherein the first metal interconnect is electrically connected to the bottom electrodes and the substrate; and
    forming a second metal interconnect sandwiched between the second portion of the top electrode and the protection device, wherein the second metal interconnect is electrically connected to the second portion of the top electrode and the protection device.

12. The method of claim 11, wherein a method of forming the capacitor on the substrate of the first region comprises:
    forming the bottom electrodes on the substrate;
    forming a dielectric layer on the substrate, wherein the dielectric layer is disposed between the bottom electrodes;
    forming the capacitor dielectric layer on the bottom electrodes, wherein the capacitor dielectric layer covers top surfaces of the bottom electrodes and the dielectric layer; and
    forming the top electrode on the capacitor dielectric layer.

13. The method of claim 12, wherein the dielectric layer and the bottom electrodes are coplanar, and the capacitor dielectric layer is a continuous planar structure.

14. The method of claim 11, wherein a method of forming the capacitor on the substrate of the first region comprises:
    forming the bottom electrodes on the substrate;
    conformally forming the capacitor dielectric layer on the bottom electrodes, wherein the capacitor dielectric layer covers top surfaces and sidewalls of the bottom electrodes; and
    forming the top electrode on the capacitor dielectric layer.

15. The method of claim 14, wherein the capacitor dielectric layer and the top electrode above the capacitor dielectric layer are continuous nonplanar structures.

16. The method of claim 11, wherein a method of forming the capacitor on the substrate of the first region comprises:
    forming the bottom electrodes and the capacitor dielectric layer on the substrate in order, wherein the capacitor dielectric layer is a non-continuous planar structure covering top surfaces of the bottom electrodes;
    respectively forming a plurality of spacers on sidewalls of the bottom electrodes and the capacitor dielectric layer; and
    forming the top electrode on the capacitor dielectric layer, wherein the top electrode covers a top surface of the capacitor dielectric layer and top surfaces and sidewalls of the spacers.

17. The method of claim 16, wherein a method of respectively forming the spacers on the sidewalls of the bottom electrodes and the capacitor dielectric layer comprises:
    respectively forming a plurality of sacrificial layers on the capacitor dielectric layer;
    conformally forming a spacer material layer on the sacrificial layers;
    removing the spacer material layer on top surfaces of the sacrificial layers to respectively form the spacers on the sidewalls of the bottom electrodes and the capacitor dielectric layer; and
    removing the sacrificial layers.

18. The method of claim 17, wherein the material of the sacrificial layers includes oxide, nitride, or a combination thereof.

19. The method of claim 17, wherein the material of the spacer material layer includes nitride, aluminum oxide, or a combination thereof.

20. The method of claim 11, wherein after the capacitor is formed, the top electrode is further patterned to form a plurality of strip top electrodes.

* * * * *